(12) United States Patent
Toncich et al.

(10) Patent No.: US 6,744,327 B2
(45) Date of Patent: Jun. 1, 2004

(54) TUNABLE VOLTAGE CONTROLLED OSCILLATOR

(75) Inventors: Stanley S. Toncich, San Diego, CA (US); Tim Forrester, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 0 days.

(21) Appl. No.: 10/670,075

(22) Filed: Sep. 24, 2003

(65) Prior Publication Data

US 2004/0056730 A1 Mar. 25, 2004

Related U.S. Application Data

(63) Continuation of application No. 10/118,530, filed on Apr. 8, 2002, now abandoned.
(60) Provisional application No. 60/283,093, filed on Apr. 11, 2001.

(51) Int. Cl.$^7$ .............................. H03B 5/08; H03B 5/12

(52) U.S. Cl. .............................. 331/117 R; 331/177 V

(58) Field of Search ...................... 331/36 C, 117 R, 331/117 FE, 117 D, 167, 177 R, 177 V

(56) References Cited

U.S. PATENT DOCUMENTS 5,777,839 A   7/1998   Sameshina et al.

FOREIGN PATENT DOCUMENTS

| EP | 1 058 333 A2 | 6/2000 |
|---|---|---|
| EP | 1 058 333 A3 | 7/2001 |
| WO | PCT WO 00/24079 | 4/2000 |

OTHER PUBLICATIONS

Galt, David et al., Ferroelectric Thin Film Characterization Using Superconducting Microstrip Resonators, IEEE Trans on Appl Superconductivity Jun. 1995 IEEE, pp 2575–2578, vol. 5, No. 2, Piscataway, NJ, USA.
Vendik, D. G. et al., 1GHz tunable resonator on bulk single crystal SrTiO3 plated with YBa2Cu307–x films, Electronics Letters, Apr. 13, 1995, vol. 31, No. 8, IEE Stevenage, GB.
Kozyrev, A. et al., Ferroelectric Films: Nonlinear Properties and Applications in Microwave Devices, 1998 IEEE MTT–S Digest, May 1998, pp 985–988, 1998 IEEE MTT–S Intl Baltimore, MD, IEEE USA.
Gevorgian, Spartak S. et al., HTS/Ferroelectric Devices for Microwave Applications, IEEE Transactions on Applied Superconductivity, Jun. 1997, pp 2458–2461, IEEE, USA.
Keis, V. N. et al., 20GHz tunable filter based on ferroelectric (BaSr)TiO3 film varactors, Electronics Letters, May 28, 1998, vol. 34, No. 11, IEE Stevenage, GB.
International Search Report: PCT/IB 02/01028, Apr. 2, 2002.
International Search Report: PCT/IB 02/01030, Apr. 2, 2002.
International Search Report: PCT/IB 02/01097, Apr. 5, 2002.
International Search Report: PCT/IB 02/01119, Apr. 9, 2002.

*Primary Examiner*—David Mis

(57) ABSTRACT

A voltage controlled oscillator incorporating a ferroelectric capacitor in its resonant circuit is provided in order to provide superior phase noise performance and a linear control voltage/capacitance relationship. The resonant circuit may include multiple ferroelectric capacitors and multiple control voltages in order to provide band switching capability and/or increase the tuning range of the oscillator. The feedback loop of the oscillator may also incorporate a ferroelectric capacitor in order to adaptively optimize the feedback.

17 Claims, 5 Drawing Sheets

TUNABLE VOLTAGE CONTROLLED OSCILLATOR

CROSS-REFERENCE TO RELATED APPLICATIONS

This application is a continuation of U.S. application Ser. No. 10/118,530 filed Apr. 8, 2002 now abandoned and which claims the benefit of U.S. Provisional Application No. 60/283,093 filed Apr. 11, 2001, which is hereby incorporated by reference. In addition, this application relates to the following U.S. applications, which are hereby incorporated by reference: Ser. No. 09/904,631 filed on Jul. 13, 2001, by Stanley S. Toncich entitled "Ferro-Electric Tunable Filter"; Ser. No. 09/912,753 filed on Jul. 24, 2001 by Stanley S. Toncich entitled "Tunable Ferro-Electric Multiplexer"; Ser. No. 09/927,732 filed on Aug. 8, 2001, by Stanley S. Toncich entitled "Low Loss Tunable Ferro-Electric Device and Method of Characterization"; Ser. No. 09/927,136 filed on Aug. 10, 2001, by Stanley S. Toncich entitled "Tunable Matching Circuit"; Ser. No. 10/044,522 filed on Jan. 11, 2002, by Stanley S. Toncich entitled "Tunable Planar Capacitor"; Ser. No. 10/077,654 filed on Feb. 14, 2002, by Stanley S. Toncich entitled "Tunable Isolator Matching Circuit"; Ser. No. 10/076,171 filed on Feb. 12, 2002, by Stanley S. Toncich entitled "Antenna Interface Unit"; Ser. No. 10/075,896 filed Feb. 12, 2002, by Stanley S. Toncich entitled "Tunable Antenna Matching Circuit"; Ser. No. 10/075,727 filed Feb. 12, 2002, by Stanley S. Toncich and Tim Forrester entitled "Tunable Low Noise Amplifier"; Ser. No. 10/075,507 filed on Feb. 12, 2002, by Stanley S. Toncich entitled "Tunable Power Amplifier Matching Circuit".

FIELD OF THE INVENTION

The present invention relates generally to tunable electronic devices and components and, more particularly, to voltage controlled oscillators incorporating tunable ferroelectric components.

BACKGROUND OF THE INVENTION

Radio frequency bandwidth is a scarce resource that is highly valued and is becoming increasingly congested. Ever-increasing numbers of users are attempting to co-exist and to pass ever-increasing amounts of information through the finite amount of bandwidth that is available. The radio spectrum is divided into frequency bands that are allocated for specific uses. In the United States, for example, all FM radio stations transmit in the 88–108 MHz band and all AM radio stations transmit in the 535 kHz–1.7 MHz band. The frequency band around 900 MHz is reserved for wireless phone transmissions. A frequency band centered around 2.45 GHz has been set aside for the new Bluetooth technology. Hundreds of other wireless technologies have their own band of the radio spectrum set aside, from baby monitors to deep space communications.

Communications within a given frequency band occur on even more narrowly and precisely defined channels within that band. Hence, in virtually any wireless communication system or device, frequency agility is required and accurate frequency generation is of critical importance. Frequency generation is typically provided by an electronic oscillator. As is well known in the art, an electronic oscillator is a circuit that produces an output signal of a specific frequency, and consists generally of an amplifier having part of its output returned to the input by means of a feedback loop. A very simple electronic oscillator includes some combination of a capacitor with an inductor or other resonator.

The capacity for frequency channel selection and changing can be provided by a voltage controlled oscillator ("VCO"). In a VCO, a control voltage is applied to a voltage dependent capacitor, commonly referred to as a variable capacitance diode, varicap diode or varactor, in order to tune the VCO to a particular frequency. FIG. 1 illustrates a conventional varicap diode tuned oscillator resonant circuit 100. Circuit 100 includes varicap diode D1 and resonator L1 (L1 is an inductor or some other form of resonant transmission line device). Control voltage V1 is applied across varicap diode D1 via input resistance R1. V1 is a DC control voltage and is applied to tune the oscillator over a specified range. DC blocking capacitor C1 is interposed between varicap diode D1 and inductor L1, and DC blocking capacitor C2 is interposed between inductor L1 and an oscillator sustaining amplifier (not shown). Typically, the sustaining amplifier is a negative impedance generator. As is well known in the art, phase-locked loop (PLL) control circuitry will also typically be provided in conjunction with the VCO.

When a reverse voltage (V1) is applied to varicap diode D1, the insulation layer between the p-doped and n-doped regions of the semiconductor thickens. A depletion region that is essentially devoid of carriers forms in diode D1, and behaves as the dielectric of the capacitor. The depletion region increases as the reverse voltage across it increases, and since capacitance varies inversely as dielectric thickness, the junction capacitance decreases as the reverse voltage increases. The effect is similar to separating the two plates of a capacitor by a-larger distance, which decreases the capacitance. So, by varying the control voltage V1 the junction capacitance provided by varicap diode D1 can be varied. Varying the capacitance, in turn, changes the resonant frequency of inductor L1 and hence the frequency that will be amplified and output by circuit 100.

In recent years, VCO designers have been required to comply with significantly more demanding specifications Currently, only a handful of manufacturers world wide can economically produce VCOs that are suitable for use in high volume consumer communication devices. Two of the major hurdles faced in VCO design are (1) phase noise and (2) the inherent non-linear transfer function (applied voltage versus capacitance) of varicap diodes.

One critical parameter of oscillator performance is its single sideband phase noise, or simply "phase noise". Phase noise affects the receiver's ability to reject unwanted signals on nearby channels. It is the ratio of the output power divided by the noise power at a specified offset and is expressed in dBc/Hz. FIG. 2 is a graph showing the typical phase noise requirement for a 1 GHz VCO. As can be seen, at an offset of about 60 kHz a 1 GHz oscillator specifies a phase noise of about −120 dBc/Hz.

One of the main stumbling blocks to achieving this performance is the loaded Q of the oscillator circuit. The sustaining amplifier of the oscillator does not usually play a significant factor in phase noise determination due to the availability of low noise semiconductors that are specifically optimized for this purpose. The loaded Q of the resonator structure (L1) is typically the dominant factor in determining the overall phase noise performance. The loaded Q of the resonator is frequently limited by the series resistance of the varicap diode, which can be as much as several ohms.

The Q of a capacitor can be expressed by:

$Q = X_c/R_s$, where $X_c$ is the reactance of the varicap diode given by $X_c = 1/(2 \cdot \pi \cdot f \cdot c)$, and $R_c$ is the effective series resistance of the varicap diode.

If a required capacitance of 5 pF at a frequency of 1.5 GHz is assumed, a reactance $X_c$ of 21.22Ω results. If it is further assumed that the effective series resistance $R_s$ of the varicap diode is 0.5Ω, the resultant Q of the varicap diode is 42.44. Hence, reducing the effective series resistance will have a direct impact on the Q of the varicap diode and the loaded Q of the entire resonator structure.

Another critical parameter in oscillator performance is the linearity (or lack thereof) in the transfer function (applied voltage versus capacitance) of the varicap diode. FIG. 3 is a chart plotting the capacitance of a typical varicap diode versus a typical tuning voltage range for the diode in a mobile phone (0.3V to 2.7V). As can be seen, it is not a linear relation. Below 0.5V, unit voltage changes lead to much greater unit capacitance changes. Consequently, the MHz/volt frequency shift of the oscillator is not constant across the tuning range. This leads to compromise in the design of the PLL loop filter and thus overall noise performance.

Another problem associated with the use of varicap diodes is that, since it is a reverse-biased diode junction, it is important that the applied AC signal does not overcome the bias voltage and result in heavy forward conduction of the diode. If this occurs the Q of the resonator will be dramatically lowered and various oscillator parameters such as phase noise and general spectral purity will be seriously impacted. In an extreme case, the oscillator may fail to maintain a continuous oscillation and degenerate into parasitic uncontrolled burst oscillations.

In view of the above, there is a need for a voltage controlled oscillator that exhibits better phase noise performance and a more linear voltage/capacitance transfer function.

SUMMARY OF THE INVENTION

The present invention provides a voltage controlled oscillator that incorporates a tunable ferroelectric capacitor to provide better phase noise performance and a more linear voltage/capacitance transfer function.

Accordingly, in one embodiment of the invention, a voltage controlled oscillator is provided that has a resonant circuit for generating a tuning frequency. The resonant circuit comprises an inductive element and a ferroelectric capacitor having a variable capacitance. A control line is coupled to the ferroelectric capacitor for applying a control voltage to the capacitor to vary the capacitance which, in turn, varies the tuning frequency of the resonant circuit.

In another embodiment of the invention, a voltage controlled oscillator is provided. The oscillator includes a resonant circuit having a first variable ferroelectric capacitor to generate a signal having a variable resonant frequency, and an amplifier coupled to the resonant circuit to amplify the signal. A feedback loop coupled between the amplifier and the resonant circuit incorporates a second ferroelectric capacitor to control the amplitude and phase of a feedback signal.

Another embodiment of the invention comprises a band-switchable oscillator resonant circuit. The circuit has first and second ferroelectric capacitors and first and second control voltage lines to facilitate band switching.

The present invention also provides a method for band switching in a voltage controlled oscillator. First and second ferroelectric capacitors are provided, and first and second control voltages are applied to the first and second capacitors so that either the first capacitor or the second capacitor dominates the output frequency of the oscillator.

Other features, objects and implementations of the invention will be or will become apparent to one with skill in the art upon examination of the following figures and detailed description. All such additional features, objects and implementations are intended to be included within this description, to be within the scope of the invention and to be protected by the accompanying claims.

DETAILED DESCRIPTION OF THE INVENTION

VCOs currently in use typically employ a varicap diode as a frequency tuning device. These VCOs exhibit compromised phase noise performance and a non-linear capacitance/control voltage transfer function. In order to overcome these shortcomings, the present invention provides a voltage controlled oscillator employing a ferroelectric capacitor, rather than a varicap diode, as the tuning device.

The background, advantages, topologies and test methods associated with ferroelectric capacitors are fully set forth in commonly owned U.S. provisional application Ser. No. 60/283,093 filed on Apr. 11, 2001, as well as commonly owned related application Ser. Nos. 09/904,631; 09/912,753; 09/927,732; 09/927,136; 10/044,522; 10/077,654; 10/076,171; 10/075,896; 10/075,727; and 10/075,507, which are hereby incorporated by reference. Briefly, these applications disclose test methods utilizing narrowband resonant circuits that accurately measure and characterize the loss due to use of a ferroelectric material, and establish that ferroelectric components are not as lossy as previously thought. Previous testing methods and devices did not account for all loss mechanisms and it was therefore not possible to accurately determine the loss due to use of ferroelectric material. In one implementation, the narrowband resonant circuit used for testing is a microstrip resonator having a gap to define the capacitor, and a ferroelectric film deposited in the gap.

By employing proper testing methods and loss accounting mechanisms, tunable ferroelectric components can be optimized and designed for use in a wide variety of low loss applications and frequency agile circuits. The choice of topology is critical for attaining the best possible Q (lowest losses). Depending on the particular topology and materials that are employed, and the applicable frequency range, Qs of greater than 80, greater than 180 and even higher are attainable. Design procedures and implementation details are set forth for gap capacitors, overlay capacitors and interdigital capacitors. The lowest losses are achieved by direct fabrication of the ferroelectric capacitor to the resonator or other RF circuitry. This eliminates added losses caused by attachment of the ferroelectric capacitor to a circuit.

Figure 1:
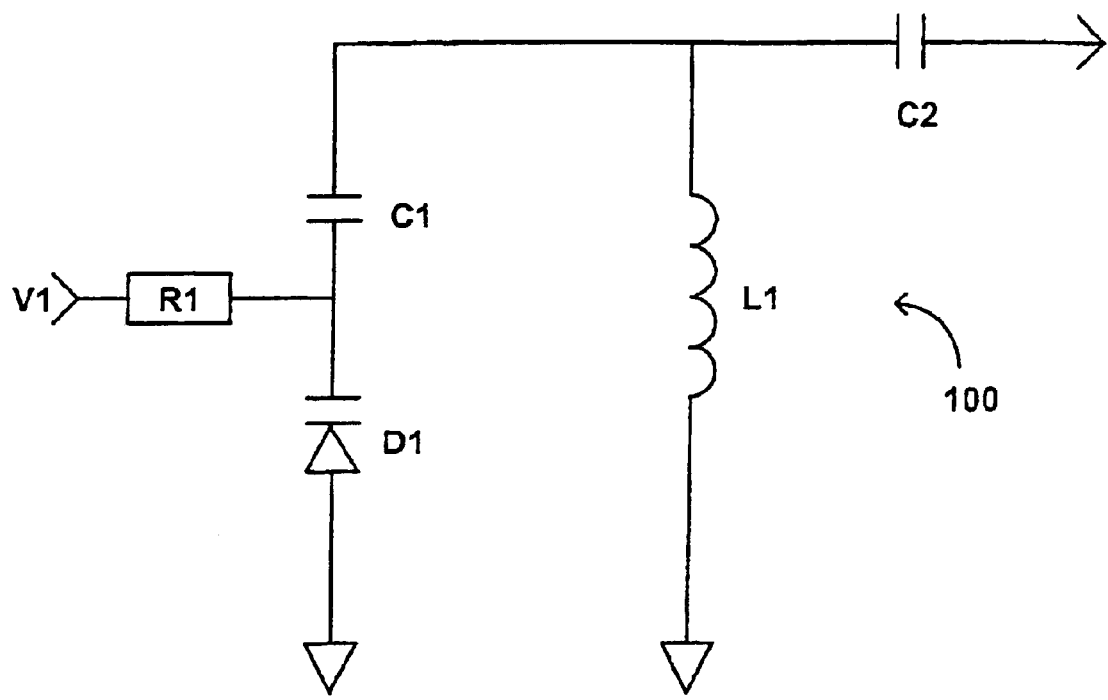
FIG. 1 is a schematic of a conventional varicap diode tuned oscillator resonant circuit.
Figure 4:
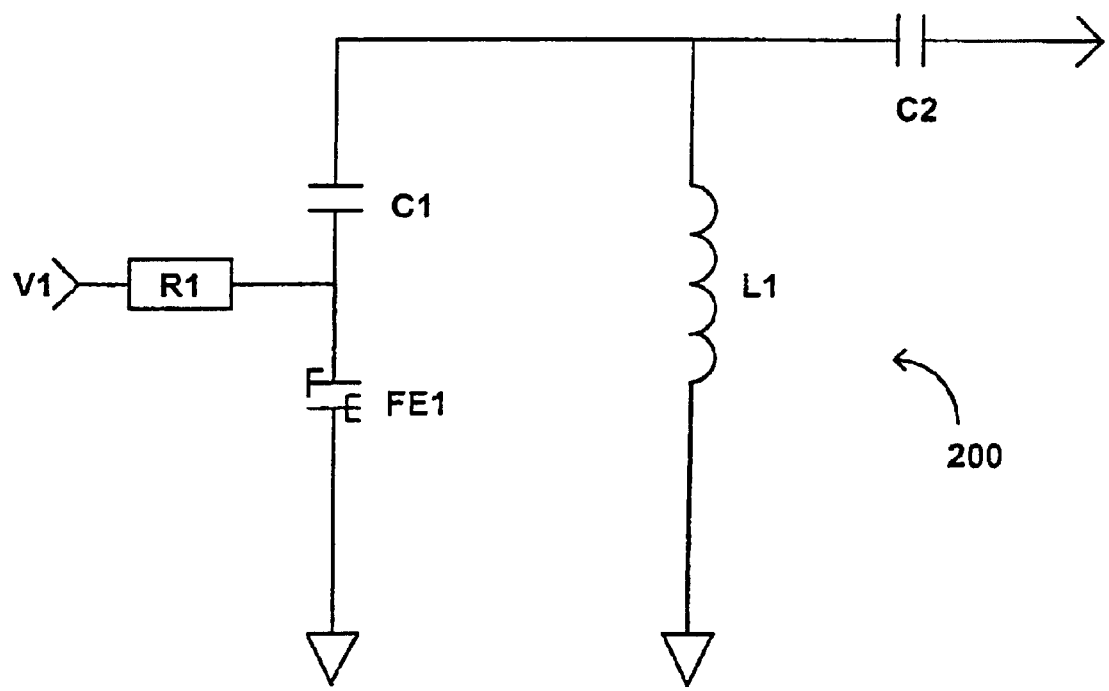
FIG. 4 is a schematic of a ferroelectric tuned oscillator resonant circuit according to the present invention.
Figure 2:
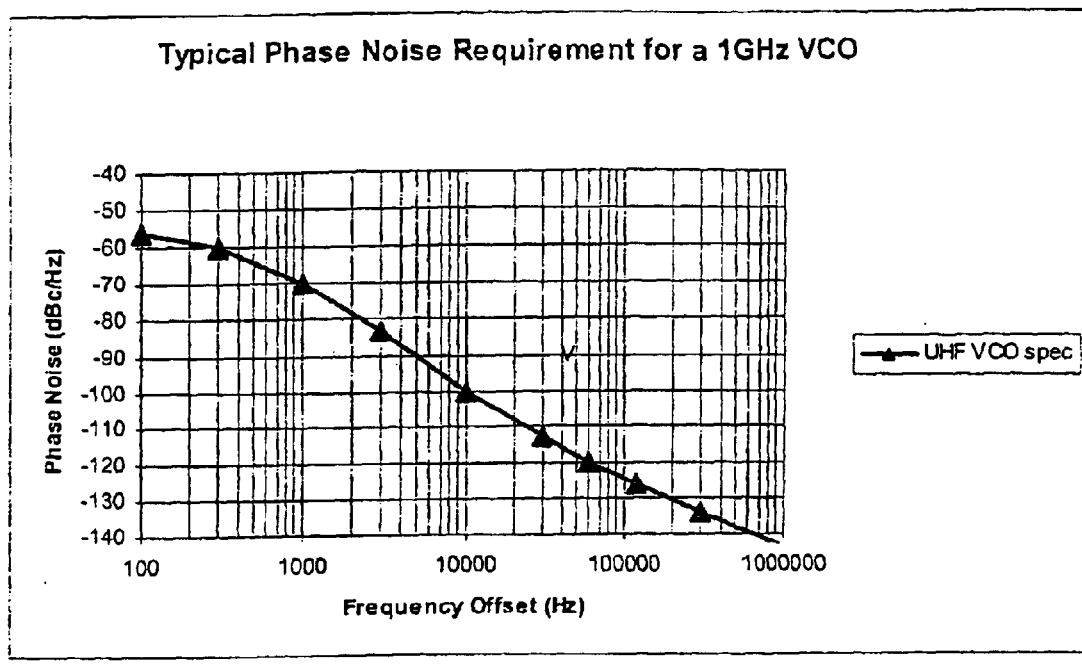
FIG. 2 is a graph plotting phase noise versus frequency offset requirements for a typical 1 GHz voltage controlled oscillator.
Figure 3:
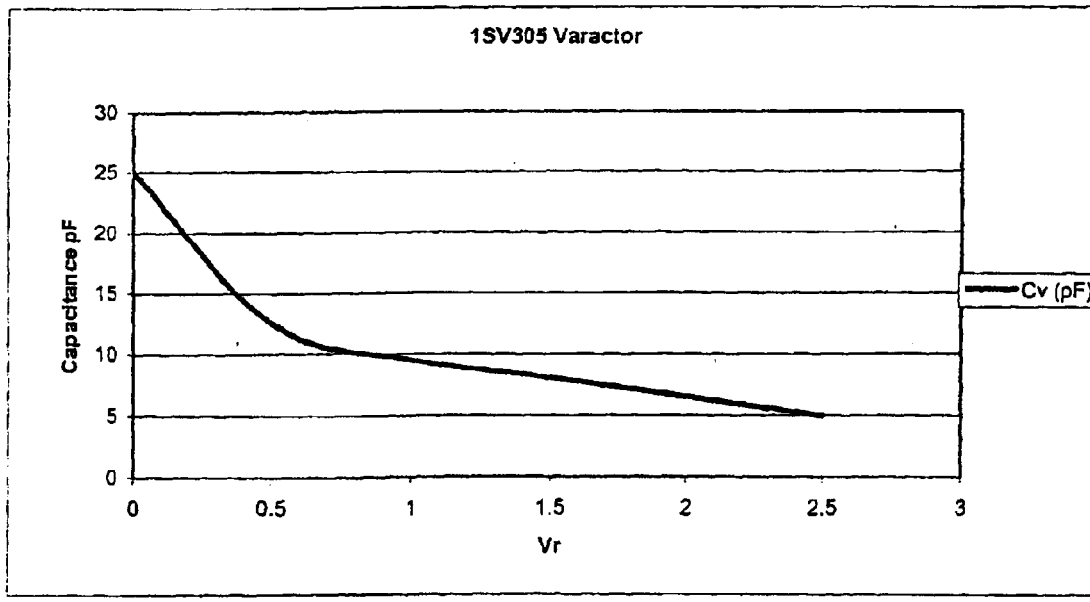
FIG. 3 is a graph plotting capacitance versus applied control voltage for a typical varicap diode.

FIG. 4 depicts a ferroelectric tuned oscillator resonant circuit 200 according to a first embodiment of the present invention. VCO 200 is similar to VCO 100 depicted in FIG. 1, but utilizes a ferroelectric capacitor FE1 rather than a varicap diode D1. Ferroelectric capacitor FE1 is constructed, tested and integrated into circuit 200 as described in the applications noted above and incorporated by reference. L1 is an inductor or other resonant transmission line device. The output of circuit 200 leads to an oscillator sustaining amplifier (not shown).

Figure 5:
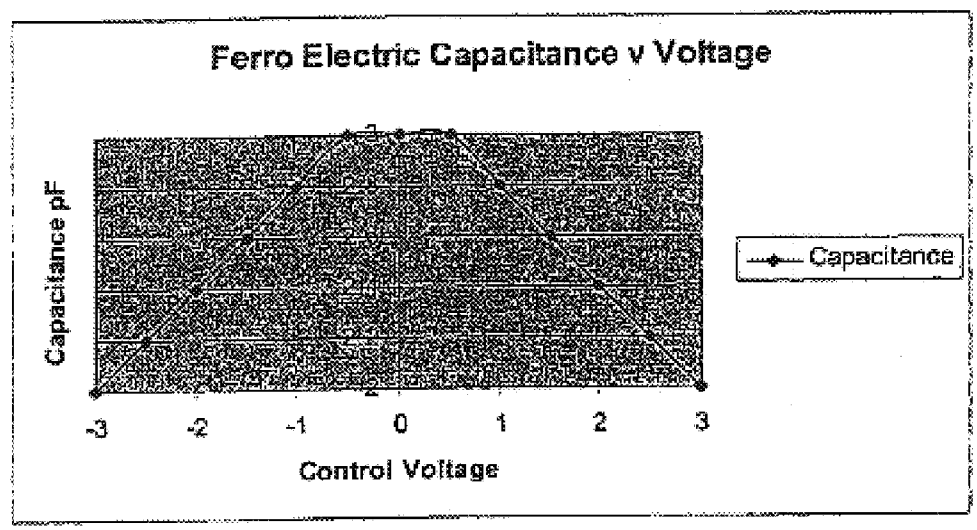
FIG. 5 is a graph plotting capacitance versus applied control voltage for a ferroelectric capacitor according to the present invention.

A variable ferroelectric capacitor has several advantages over a varicap diode. First, it has a much lower series resistance, typically by a factor of ten. This will directly result in a higher loaded Q ($Q=X_c/R_s$, see discussion above) and better phase noise performance. Secondly, as plotted in FIG. 5, the capacitance/applied voltage transfer function of a ferroelectric capacitor is essentially linear, thereby permitting the design of more optimum PLL loop filters. Finally, ferroelectric capacitors do not suffer from the forward bias conduction problems of varicap diodes. This final aspect permits the design of novel band-switching oscillators, as will be described below.

Figure 6:
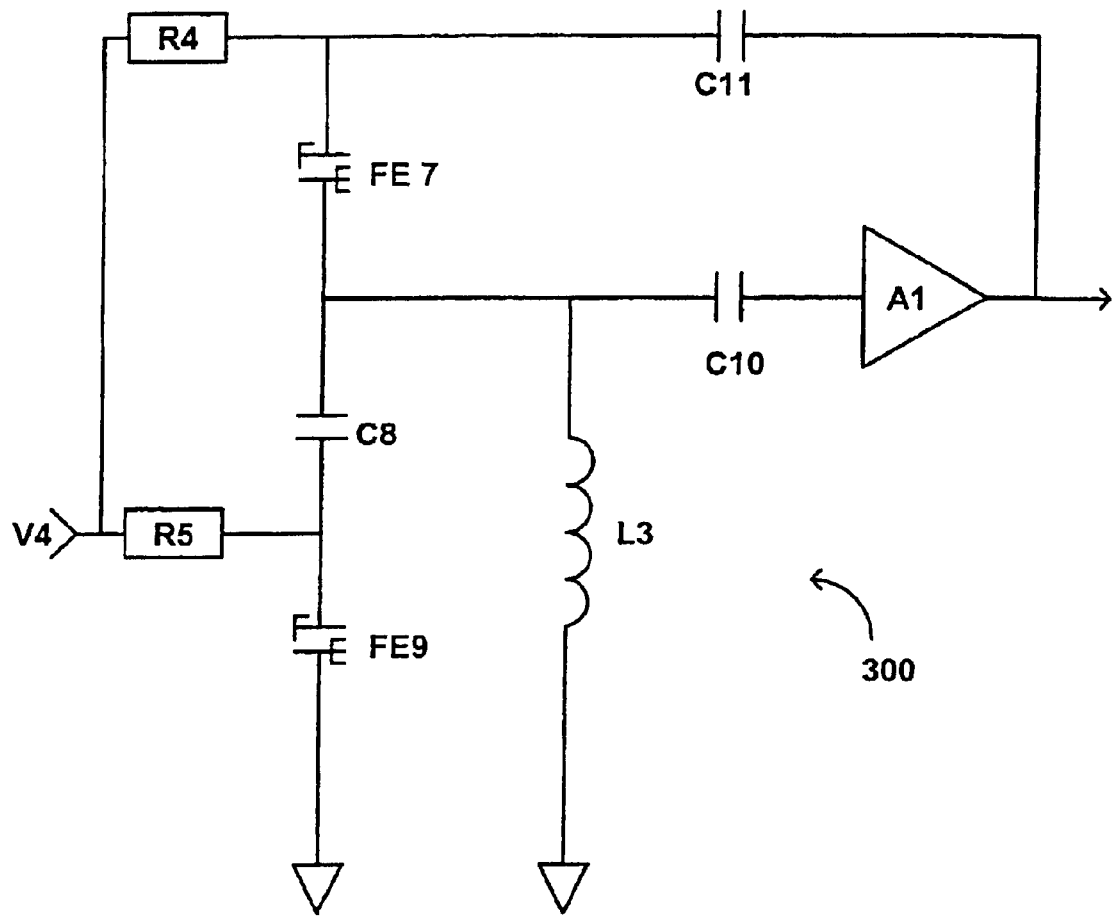
FIG. 6 is a schematic of a ferroelectric tuned oscillator circuit with adaptive feedback according to the present invention.

In addition to setting the desired operating frequency, it -is also possible to use a combination of ferroelectric variable capacitors to adjust the oscillation sustaining feedback path. This second embodiment of the invention is illustrated in FIG. 6. By simultaneously adjusting the level of feedback in conjunction with changing the frequency, the performance of the oscillator is maintained over a wider bandwidth. A conventional oscillator, such as the oscillator depicted in FIG. 1, has an optimum operating frequency where its output is at its best performance, in terms of spectral purity and RF power. This is sometimes described as the oscillator's "sweet spot". Maintaining this optimum feedback is important, especially for oscillator designs that are required to tune across a wide bandwidth (greater than fifteen percent of the oscillator center frequency). As the oscillator is tuned away from its sweet spot and moves towards its limits of tuning, however, the RF output power frequently drops and the phase noise (or spectral purity) is degraded.

As illustrated in FIG. 6, it is possible to use a second ferroelectric component to maintain optimum performance across a wider bandwidth by varying the feedback parameters with the desired operating frequency. In order for oscillator 300 to produce a comparatively spectrally pure signal, the open loop peak gain of the oscillator must correspond to the zero phase shift point around the entire loop. A failure to maintain this relationship across the tuning range will lead to degraded oscillator performance. In an extreme case, the oscillator may stop oscillating.

In circuit 300 of FIG. 6, FE7 and FE9 are ferroelectric variable capacitors. Capacitor C8 is a DC blocking capacitor, but could also optionally be a ferroelectric capacitor. Capacitors C10 and C11 are DC blocking capacitors. In operation, control voltage V4 is used to vary the capacitance of ferroelectric capacitor FE9. The 5 capacitance of capacitor FE9, in conjunction with the other components (primarily capacitor C8 and inductor L3) sets the oscillator frequency that is output by amplifier A1. Varying control voltage V4 therefore proportionally varies the oscillator frequency. Control voltage V4, in addition, controls the DC potential across ferroelectric capacitor FE7. Hence, the capacitance of FE7 also varies with the applied control voltage. By careful design and selection of capacitors C7, C10 and C11, the amplitude and phase of the feedback signal is accurately controlled at the desired frequency, thereby maintaining optimum performance.

Figure 7:
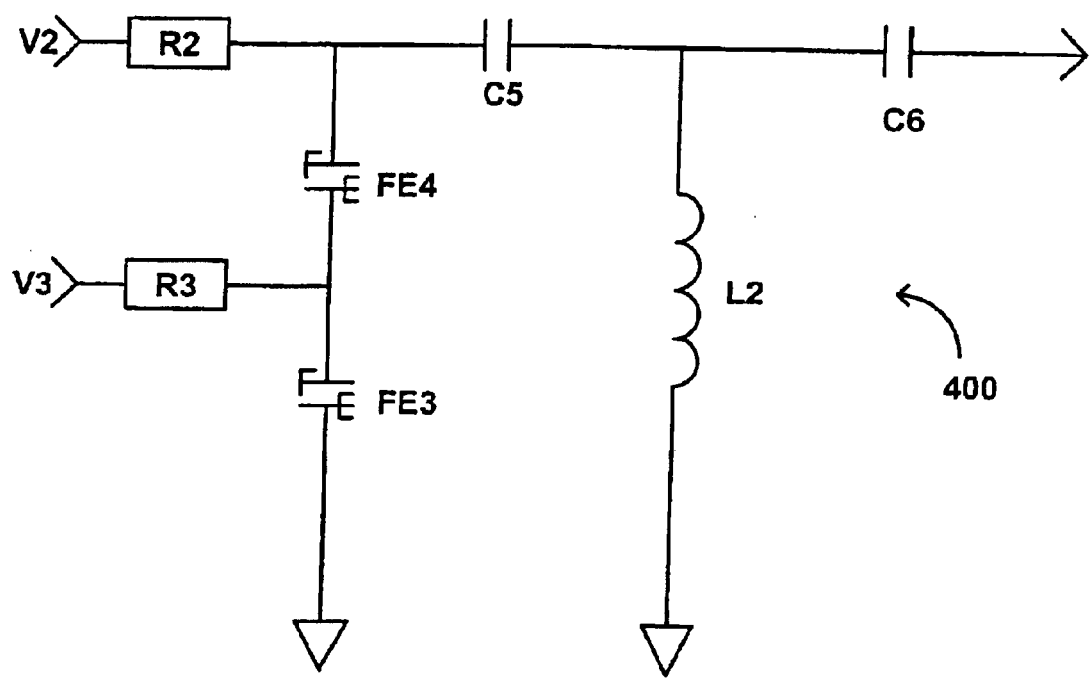
FIG. 7 is a schematic of a band-switchable ferroelectric tuned oscillator resonant circuit according to the present invention.

A third embodiment of the invention, illustrated in FIG. 7, utilizes ferroelectric capacitors to provide a novel band-switching oscillator 400. Circuit 400 can be configured in a number of ways to provide effective band-switching or to affect the available tuning range. Capacitors FE3 and FE4 are ferroelectric components, and capacitors C5 and C6 are DC blocking capacitors. The output line from capacitor C6 leads to the oscillator sustaining amplifier (not shown).

Circuit 400 has two control voltage inputs: V2 and V3. The frequency of oscillation produced by circuit 400 can be affected by varying control voltages V2 and V3 either together or independently. Multiple scenarios are possible. In a first scenario, a single (the same) control voltage is applied to both V2 and V3. This makes the control voltage across capacitor FE4 effectively zero, thereby setting its capacitance to its maximum value. Thus, the voltage across FE3 and hence its capacitance effectively dominate the frequency setting. In a second scenario, control input V3 is grounded and a control voltage is applied to V2. In this scenario, there is no potential difference across FE3 and its capacitance therefore is set to its maximum value. The voltage across FE4 and hence its capacitance effectively dominate the frequency setting. Hence, by choosing different capacitance ranges for FE4 and FE3, effective band-switching can be provided by setting the control voltages as described in the first and second scenarios.

In a third scenario, a control voltage is applied to V3 and control voltage V2 is grounded. In this scenario, both FE3 and FE4 experience the same DC control voltage and thus shift in capacitance. From an AC aspect, the capacitors are effectively in series, thereby significantly increasing the operating frequency and permitting coverage of other communication bands. Similar results may be obtained by applying different control voltages to V2 and V3.

Other embodiments and implementations of the invention will be or will become apparent to one with skill in the art. All such additional embodiments and implementations are intended to be included within this description, to be within the scope of the invention and to be protected by the accompanying claims.

What is claimed is:

1. A voltage controlled oscillator having a resonant circuit for generating a tuning frequency, the resonant circuit comprising:

an inductive element;

a ferroelectric capacitor having a variable capacitance; and a control line coupled to the ferroelectric capacitor for applying a control voltage to the capacitor, the control voltage varying the capacitance which, in turn, varies the tuning frequency of the resonant circuit.

2. An oscillator as claimed in claim 1, wherein the control voltage has a linear relation to the capacitance across the tuning range of the capacitor.

3. An oscillator as claimed in claim 2, wherein the resonant circuit has a relatively high loaded Q.

4. An oscillator as claimed in claim 3, wherein the resonant circuit has a loaded Q of at least 180.

5. A voltage controlled oscillator comprising a resonant circuit, the resonant circuit comprising a first ferroelectric capacitor configured to generate a variable resonant frequency.

6. An oscillator as claimed in claim 5, wherein the resonant circuit further comprises a second ferroelectric capacitor configured to facilitate frequency band-switching.

7. An oscillator as claimed in claim 6, wherein the first capacitor is coupled between ground and a first control voltage, and the second capacitor is coupled between the first control voltage and a second control voltage.

8. An oscillator as claimed in claim 5, and further comprising a second ferroelectric capacitor positioned in a feedback path of the oscillator to control the amplitude and/or phase of a feedback signal.

9. An oscillator as claimed in claim 8, wherein a first control voltage is applied to both the first and second ferroelectric capacitors.

10. A voltage controlled oscillator comprising:
    a resonant circuit having a first variable ferroelectric capacitor to generate a signal having a variable resonant frequency;
    an amplifier coupled to the resonant circuit to amplify the signal; and
    a feedback loop coupled between the amplifier and the resonant circuit and comprising a second ferroelectric capacitor to control the amplitude and phase of a feedback signal.

11. A voltage controlled oscillator as claimed in claim 10, wherein a first control voltage is coupled to the first and second ferroelectric capacitors.

12. A band-switchable oscillator resonant circuit comprising first and second ferroelectric capacitors and first and second control voltage lines.

13. A resonant circuit as claimed in claim 12, wherein the first control voltage line is coupled to the first and second ferroelectric capacitors, and wherein the second control voltage line is coupled to the second ferroelectric capacitor.

14. A method for band switching in a voltage controlled oscillator comprising:
    providing first and second ferroelectric capacitors;
    applying first and second control voltages to the first and second capacitors so that either the first capacitor or the second capacitor dominates the output frequency of the oscillator.

15. A method as claimed in claim 14, wherein the first control voltage is coupled to both the first and second capacitors, and wherein the second control voltage is coupled to only the second capacitor.

16. A method as claimed in claim 15, wherein the first control voltage and the second control voltage are approximately the same, causing the voltage across the second capacitor to be effectively zero and causing the first capacitor to dominate the output frequency.

17. A method as claimed in claim 15, wherein the first control voltage is grounded and the second control voltage is not grounded, causing the voltage across the first capacitor to be effectively zero and causing the second capacitor to dominate the output frequency.

* * * * *